United States Patent [19]

Komatsu et al.

[11] Patent Number: 4,577,397

[45] Date of Patent: Mar. 25, 1986

[54] METHOD FOR MANUFACTURING A SEMICONDUCTOR DEVICE HAVING VERTICAL AND LATERAL TRANSISTORS

[75] Inventors: Shigeru Komatsu, Yokohama; Hiroshi Inoue, Tokyo; Michio Nakamura, Kawasaki, all of Japan

[73] Assignee: Tokyo Shibaura Denki Kabushiki Kaisha, Japan

[21] Appl. No.: 689,966

[22] Filed: Jan. 9, 1985

Related U.S. Application Data

[60] Division of Ser. No. 523,062, Aug. 15, 1983, abandoned, which is a continuation of Ser. No. 152,296, May 22, 1980, abandoned.

[30] Foreign Application Priority Data

May 24, 1979 [JP]  Japan ................... 54-63218

[51] Int. Cl.⁴ .......................................... H01L 21/425
[52] U.S. Cl. ................... 29/576 B; 148/1.5; 148/187; 29/578
[58] Field of Search ............ 148/1.5, 187; 29/578

[56] References Cited

U.S. PATENT DOCUMENTS

| | | | |
|---|---|---|---|
| 3,971,059 | 7/1976 | Dunkley et al. | 148/1.5 X |
| 4,144,098 | 3/1979 | Roesner | 148/187 X |
| 4,157,268 | 6/1979 | Bergeron et al. | 148/1.5 |
| 4,191,595 | 3/1980 | Aomura et al. | 148/1.5 |
| 4,325,180 | 4/1982 | Curran | 148/187 X |
| 4,472,871 | 9/1984 | Green et al. | 29/576 B |

*Primary Examiner*—George T. Ozaki
*Attorney, Agent, or Firm*—Finnegan, Henderson, Farabow, Garrett & Dunner

[57] ABSTRACT

The present invention provides a semiconductor device which includes a thick countersunk oxide layer selectively formed by the LOCOS process on the surface of a silicon body, openings formed in this oxide layer, and semiconductor element regions formed by the introduction of an impurity in the silicon body through these openings.

The semiconductor element regions preferably comprise the emitter region and the collector region of the lateral transistor.

4 Claims, 11 Drawing Figures

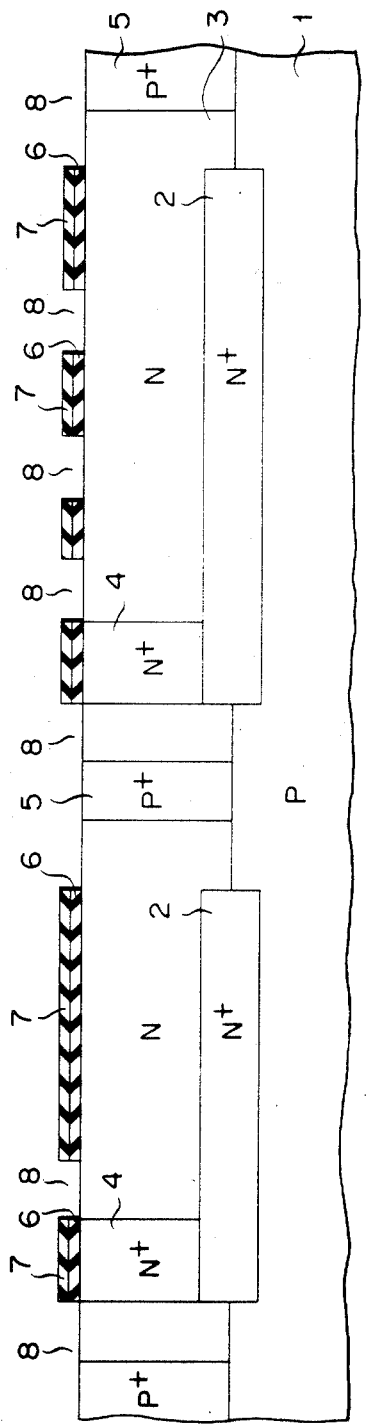
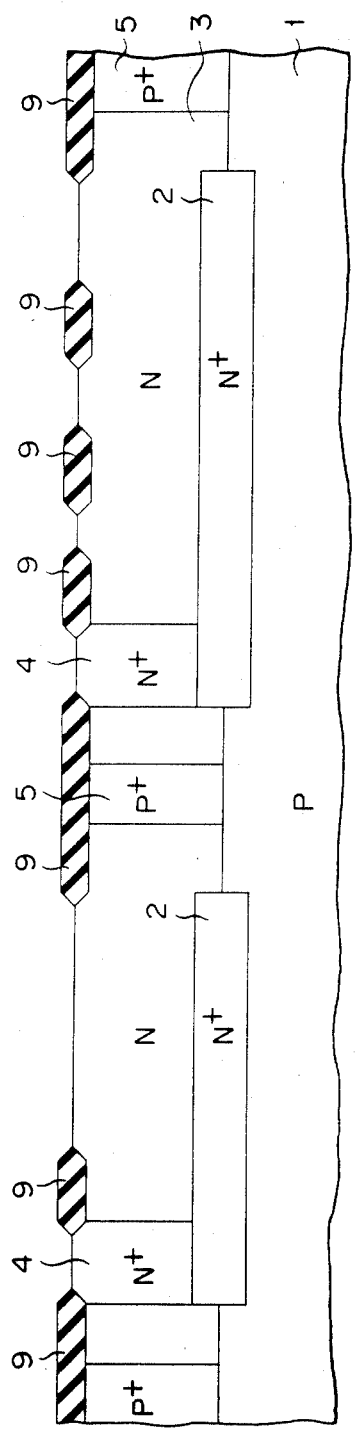
F I G. 1A (PRIOR ART)
F I G. 1B (PRIOR ART)

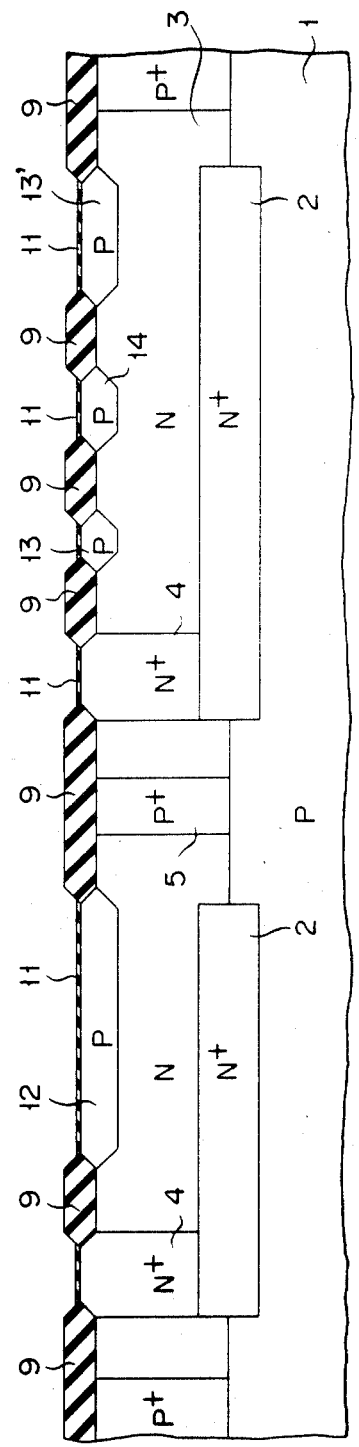
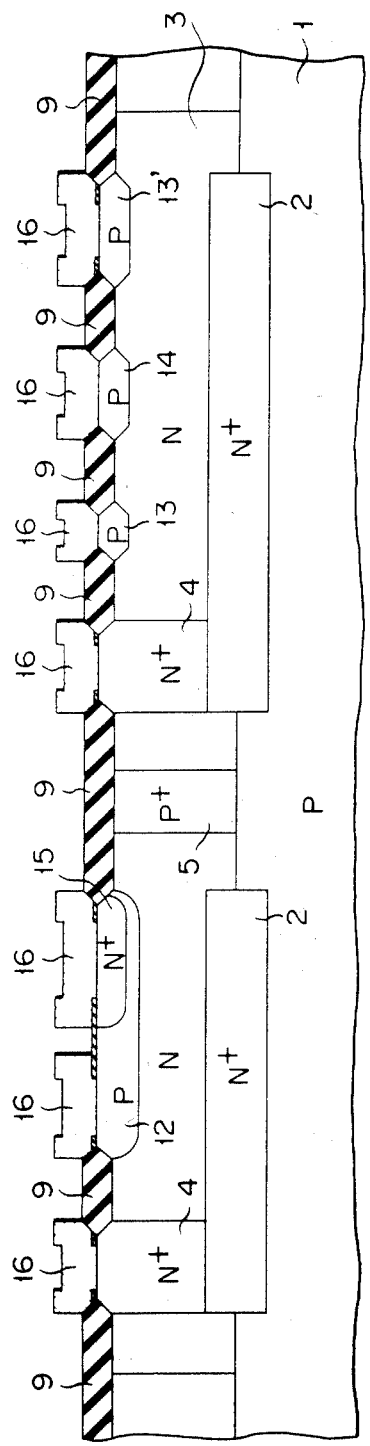
FIG. 1C (PRIOR ART)
FIG. 1D (PRIOR ART)

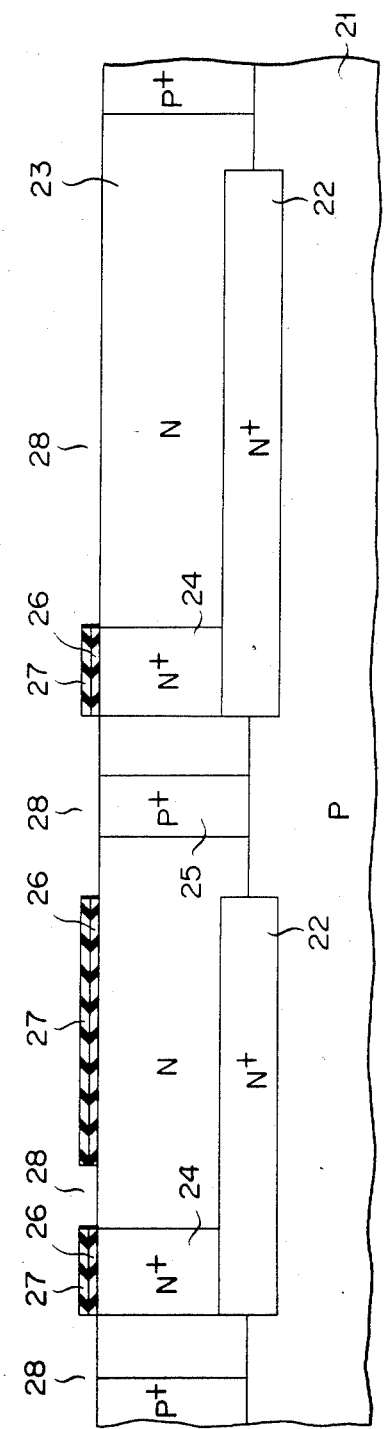
F I G. 2A

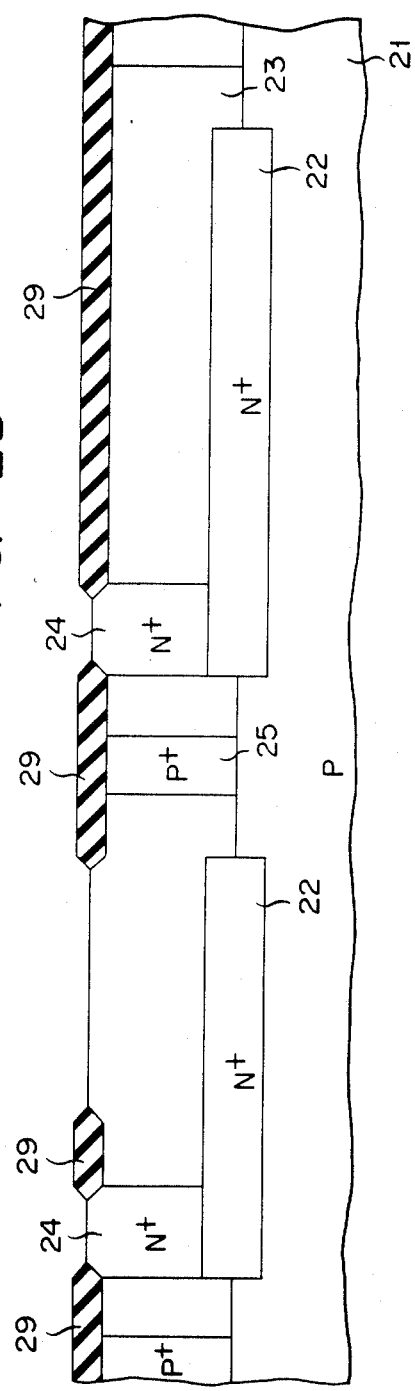
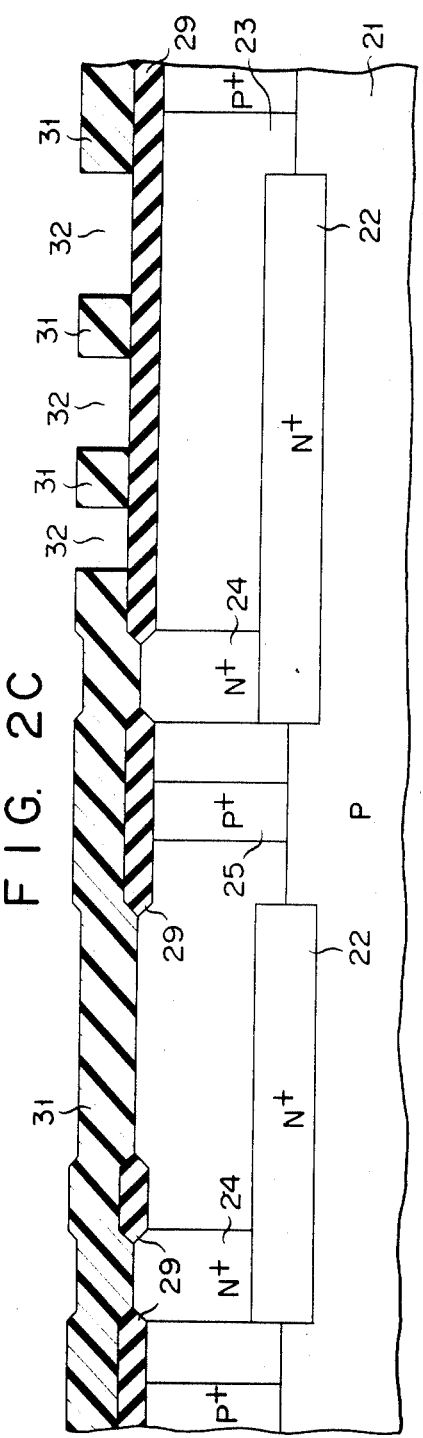

METHOD FOR MANUFACTURING A SEMICONDUCTOR DEVICE HAVING VERTICAL AND LATERAL TRANSISTORS

This is a division of application Ser. No. 523,062, filed Aug. 15, 1983, which in turn is a continuation of application Ser. No. 152,296, filed May 22, 1980, both of which are now abandoned.

The present invention relates to a semiconductor device, and more particularly, to a semiconductor device manufactured by the technique of local oxidation of silicon (LOCOS), and the manufacturing method therefor.

In the LOCOS method, an oxide layer selectively formed on the surface of a silicon body is at least partially recessed. Various advantages obtained by this LOCOS method are known. For example, it facilitates a high packing density and the reduction of capacitance, and in particular allows "self-alignment" in MOS transistors. However, in forming a vertical transistor and a lateral transistor within a single silicon substrate utilizing the same procedure, the characteristics and the reliability of the obtained lateral transistor are often adversely affected. FIGS. 1A to 1D show an example in which a vertical transistor and a lateral transistor are formed within a single silicon substrate. FIG. 1E is a schematic sectional view of the obtained lateral transistor. In FIGS. 1A to 1D, the manufacturing procedure of the vertical transistor is shown at the left and that of the lateral transistor is shown at the right.

A silicon body is prepared which includes a p-type silicon substrate 1, an n-type epitaxial layer 3 formed thereon, an $n^+$ buried layer 2, a deep $n^+$ region 4, and an element isolation region 5. An under oxide layer 6 and an upper silicon nitride layer 7 are formed in the order named on the surface of this silicon body. The under oxide layer 6 and the silicon nitride layer 7 are selectively etched away so as to form openings 8 (FIG. 1A). The exposed portion of the surface of the silicon body is thermally oxidized using the under oxide layer 6 and the silicon nitride layer as a mask so as to selectively grow countersunk oxide layers 9 of about 6,000–10,000 Å in thickness. The mask layer (6, 7) is removed thereafter (FIG. 1B). Approximately half of the countersunk oxide layer 9 is embedded in the silicon body.

Another oxide layer 11 having a thickness of 1,000–3,000 Å is formed thereover and a p-type impurity is implanted into the epitaxial layer 3 by the ion implantation method through the oxide layer 11. Thus, a base region 12 of the vertical transistor, and emitter region 14 and a collector regions 13, 13′ of the lateral transistor are respectively formed (FIG. 1C).

Lastly, an emitter region 15 of the vertical transistor is formed and openings for ohmic contact are formed and metal electrodes 16 are mounted (FIG. 1D).

FIG. 1E is a partially enlarged view of the lateral transistor of the semiconductor device manufactured by this series of procedures. In FIG. 1E, numeral 9 denotes the countersunk oxide layers; 16, the metal electrodes; 14, the emitter region; 13, the collector region; and $L_1$, the base width. Since the characteristics of the lateral transistor depend on the base width, the shape of a region 19 enclosed by the dotted lines, that is, the end portion of the countersunk oxide layer 9 which is in contact with the emitter regions 13 or with the collector region 14, is critical and influential, especially when designing with a base which is less than 10 μm in width. However, it is known that the shape of the region 19 largely depends on the conditions of oxidation, especially on the under oxide layer 6 and the oxidizing atmosphere. Consequently, the characteristics of the lateral transistor having the impurity regions, that is, the emitter region 14 and the collector region 13, connected to the region 19 which has these unstable factors, become unstable.

The primary object of the present invention is to provide a semiconductor device manufactured by the LOCOS technique wherein the distances between the impurity regions formed in the silicon body are controlled with precision, and a thick surface protective film is formed over the surface of the silicon body.

The present invention provides a semiconductor device which includes a thick countersunk oxide layer selectively formed by the LOCOS process on the surface of a silicon body, openings formed in this oxide layer, and semiconductor element regions formed by the introduction of an impurity in the silicon body through these openings.

The semiconductor element regions preferably comprise the emitter regions and the collector region of the lateral transistor. The introduction of the impurity may be accomplished by forming an oxide layer thinner than the countersunk oxide layer on the exposed portion of the silicon body and implanting the impurity ions into the silicon body by the ion implantation method through the thin oxide layer.

This invention can be more fully understood from the following detailed description when taken in conjunction with the accompanying drawings, in which:

FIGS. 1A to 1D are sectional views illustrating the manufacturing procedures of a conventional semiconductor device;

FIGS. 2A to 2E are sectional views illustrating the manufacturing procedures of an embodiment of a semiconductor device of the present invention.

Figure 1E:
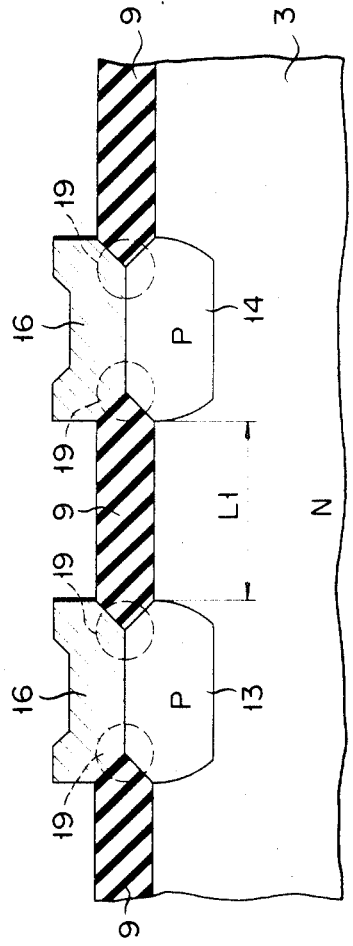
FIG. 1E is an enlarged sectional view of a part of a semiconductor device shown in FIG. 1D.

An embodiment of the present invention will now be described, referring to FIG. 2. An element separating region 25 and a deep $n^+$ region 24 are formed in a silicon body which is obtained by forming an $n^+$ type buried layer 22 and an n-type epitaxial layer 23 on a p-type silicon substrate 21. An under oxide layer 26 and a nitride layer 27 are formed thereover as an anti-oxidation mask, and the under oxide layer 26 and the nitride layer 27 are selectively etched so as to form openings 28 (FIG. 2A).

Figure 2D:
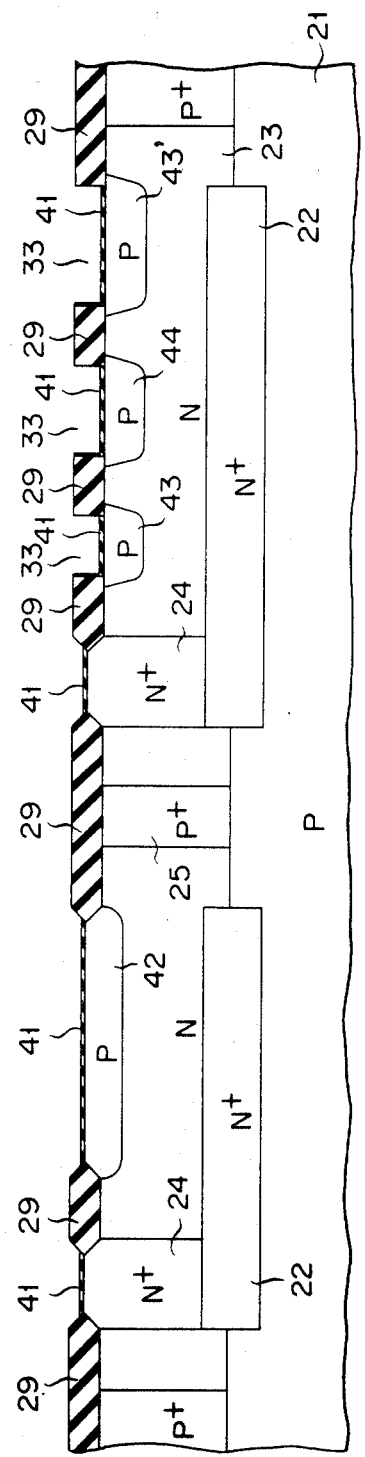
Figure 2E:
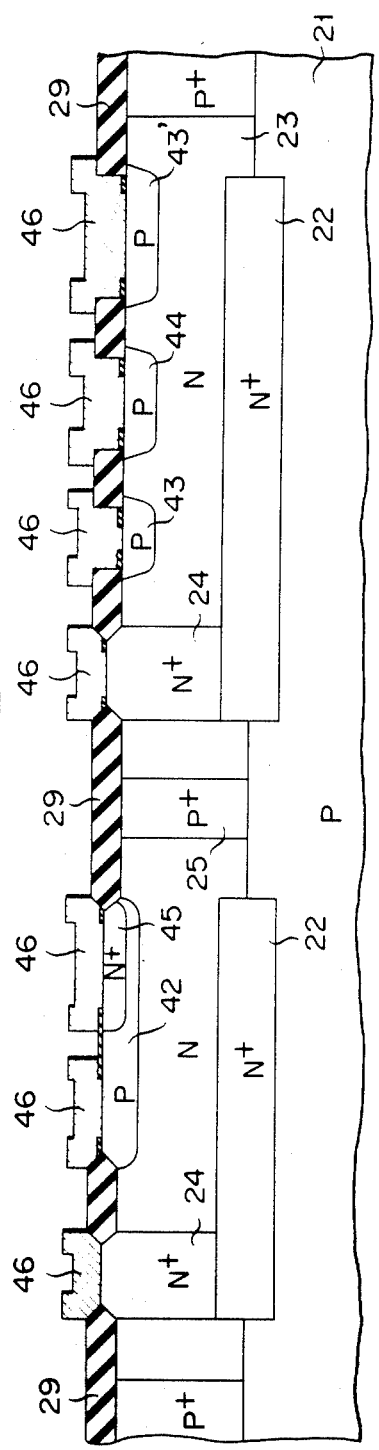

A countersunk oxide layer 29 of a desired thickness is formed on the exposed portion of the silicon body surface through the openings by methods such as steam oxidation at a suitable temperature within the range of 1,000° to 1,100° C. The thickness of the layer 29 is preferably in the range of 5,000–7,000 Å. In forming this countersunk oxide layer 29, a low temperature high speed forming method at 900°–1,000° C. utilizing pressure oxidation can be used for easy control. The nitride layer 27 and the oxide layer 26 which were used as a masking material in this selective oxidation is removed (FIG. 2B). This is accomplished by methods such as hot phosphoric acid and plasma etching. A resist layer 31 is then formed and thereafter patterned in a predetermined pattern with openings 32 by a method such as photoetching (FIG. 2C). Using the general etching method, the countersunk oxide layer 29 is partially removed through the openings 32, to form openings 33, and the resist layer 31 is removed thereafter. An oxide layer 41 is formed in an oxidizing atmosphere to a desired thickness (FIG. 2D). Impurity regions 42, 43, 43' and 44 are formed through this oxide layer 41 by the ion implantation method (FIG. 2D). An emitter region 45 of the vertical transistor is formed by the general impurity doping method. After openings for inserting electrodes are formed in each region, electrodes 46 are mounted therein (FIG. 2E).

The following advantages may be obtained with the method of the present invention as described above. In general, the precision of the openings 32 of the resist layer 31 shown in FIG. 2C depends on the pattern transfer method, the precision of the glass mask used in this transfer, the characteristics of the resist layer, and other conditions, resulting in an error called the pattern transfer error. However, the precision of the openings 33 formed in the countersunk oxide layer 29 can be improved to a desired degree by controlling the etching for forming them.

Figure 2F:
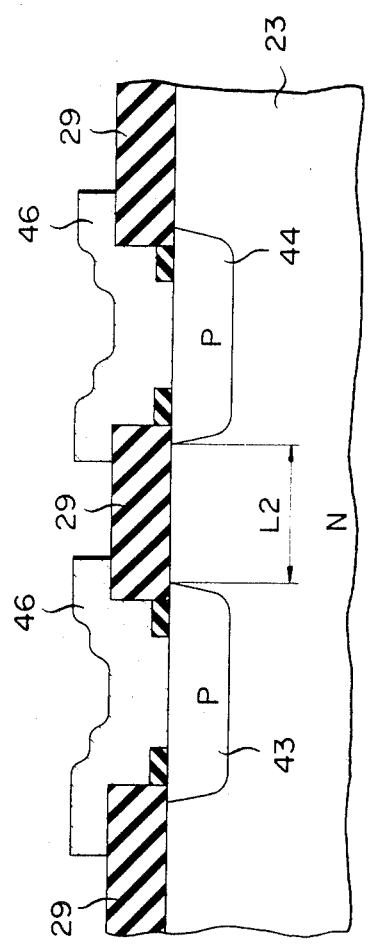
FIG. 2F is an enlarged sectional view of the device shown in FIG. 2E.

The structure of the lateral transistor manufactured by the method of the present invention is shown in FIG. 2F. That is, the emitter region 44, the collector region 43, and the base width $L_2$ are shown in this figure.

Since the control of the formation of the openings 33 (FIG. 2D) for the collector region 43 and the emitter region 44 is easy, as has already been described, the base width $L_2$ can be set with high precision. Thus, the characteristics of the lateral transistor can be precisely set. Further, since a countersunk layer 29 of sufficient thickness is formed on the base region, the structure can be made resistant to external influences.

Although the silicon body was of the p-type in the above description, this should not be construed to limit the scope of the present invention.

What we claim is:

1. A method for manufacturing from a silicon substrate a semiconductor device including a vertical transistor having a first semiconductor region of a first conductivity type, a second semiconductor region of a second conductivity type opposite to the first conductivity type formed in the first semiconductor region and a third semiconductor region of the first conductivity type formed in the second semiconductor region, and a lateral transistor having a fourth semiconductor region of the first conductivity type, a fifth semiconductor region of the second conductivity type formed in the fourth semiconductor region and a sixth semiconductor region of the second conductivity type formed in the fourth semiconductor region and spaced from the fifth semiconductor region, the method comprising the steps of:

(a) forming, within the silicon substrate and extending from a first surface thereof, the first and fourth semiconductor regions, and isolating the first and fourth semiconductor regions from one another and providing each with an exposed surface at the first surface of the silicon substrate;

(b) forming on the first surface of the silicon substrate an anti-oxidation mask having a first mask portion at the desired location of the second semiconductor region and second and third mask portions, each spaced from the first mask portion, the mask leaving exposed the exposed surface of the fourth semiconductor region;

(c) simultaneously and selectively forming, with the forming step (b), a thick countersunk first oxide layer on the portions of the first surface of the silicon substrate including the exposed surface of the fourth semiconductor region, where the mask is not formed, by heat oxidizing the first surface of the silicon substrate;

(d) removing the first mask portion to form a first opening;

(e) selectively removing portions of the first oxide layer formed on the surface of the fourth semiconductor region at the desired location of the fifth and sixth semiconductor regions, thereby forming second and third openings partially exposing the surface of the fourth semiconductor region;

(f) forming the second, fifth and sixth semiconductor regions by introducing an impurity of the second conductivity type through the first, second and third openings; and (g) forming the third semiconductor region by introducing an impurity of the first conductivity type into the second semiconductor region.

2. A method as recited in claim 1 wherein the forming step (f) comprises forming, in the first, second and third openings, a second oxide layer which is thinner than the thick countersunk first oxide layer, and implanting ions of the impurity into the silicon substrate through the second oxide layer.

3. A method as recited in claim 1, further comprising:
removing another portion of the first oxide layer formed on the surface of the fourth semiconductor region, thereby forming a fourth opening partially exposing the surface of the fourth semiconductor region, and
introducing an impurity of the second conductivity type into the fourth semiconductor region through the fourth opening, thereby forming a seventh semiconductor region.

4. A method as recited in claim 1, further comprising connecting electrodes to the second, third, fifth and sixth semiconductor regions.

* * * * *